United States Patent

Saegusa et al.

[11] Patent Number: 6,126,743
[45] Date of Patent: Oct. 3, 2000

[54] PROCESS FOR PRODUCING DIELECTRICS AND FINE SINGLE CRYSTAL POWDERS AND THIN FILM CAPACITOR

[75] Inventors: Kunio Saegusa, Ibaraki-ken; Yutaka Suzuki, Tsukuba, both of Japan

[73] Assignee: Sumitomo Chemical Company, Limited, Osaka, Japan

[21] Appl. No.: 08/590,680

[22] Filed: Jan. 29, 1996

Related U.S. Application Data

[63] Continuation of application No. 08/206,171, Mar. 7, 1994, abandoned.

[30] Foreign Application Priority Data

| Mar. 12, 1993 | [JP] | Japan | 5-052027 |
| Apr. 6, 1993 | [JP] | Japan | 5-079649 |
| Apr. 23, 1993 | [JP] | Japan | 5-097698 |
| Jul. 21, 1993 | [JP] | Japan | 5-201880 |
| Aug. 9, 1993 | [JP] | Japan | 5-197152 |

[51] Int. Cl.$^7$ .................................................. C30B 7/14
[52] U.S. Cl. ........................ 117/68; 117/54; 204/192.22; 204/192.23; 252/65.3 BT; 252/62.9; 252/309; 252/520; 501/12; 501/18; 501/134; 501/139
[58] Field of Search .............................. 361/324.4, 321.5; 501/12, 18, 134, 139; 423/69, 89, 155, 161; 117/54, 68; 204/192.22, 192.23; 252/62.3 BT, 629, 309, 313.1, 520, 521; 264/5; 427/126.3

[56] References Cited

U.S. PATENT DOCUMENTS

| 3,195,030 | 7/1965 | Herezog et al. | |
| 4,863,883 | 9/1989 | Menashi et al. | 501/138 |
| 4,888,246 | 12/1989 | Kuwata et al. | 204/192.22 |
| 4,959,089 | 9/1990 | Bhargava et al. | 427/126.3 |
| 5,011,796 | 4/1991 | Bridger et al. | 501/12 |
| 5,091,348 | 2/1992 | Woodhead et al. | 501/136 |
| 5,217,754 | 6/1993 | Santiago-Aviles et al. | 501/12 |
| 5,308,807 | 5/1994 | Moeggenborg et al. | 501/134 |
| 5,310,709 | 5/1994 | Wada et al. | 501/134 |

FOREIGN PATENT DOCUMENTS

| 5-28831 | 2/1993 | Japan . |
| 5-4713 | 2/1993 | Japan . |

OTHER PUBLICATIONS

Glastech. Ber., 62(5), pp. 187–189, (1989), Nr. 5., Park et al., "Glass–ceramics of the system $Pb(Zr_{0.5}Ti_{0.5})O_3$–$GeO_2$".

Journal of Materials Science, 4 (1969), pp. 1059–1063 (1963), D.G. Grossman et al., "Crystal Clamping in $PbTiO_3$ Glass–Ceramics".

Journal of the American Ceramic Society, vol. 47, No. 3, pp. 107–115 (1964), Andrew Herczog, "Microcrystalline $BaTiO_3$ by Crystallization from Glass".

Primary Examiner—Robert Kunemund
Attorney, Agent, or Firm—Stevens, Davis, Miller & Mosher, L.L.P.

[57] ABSTRACT

Disclosed is a process for producing dielectrics which satisfy the formula of:

$$WXMO_3\text{—}(1\text{—}w)(XO_y\text{—}aGO_z)$$

wherein the symbols are as defined in the specification, which comprises mixing an oxide of X, an oxide of M and an oxide of G or compounds capable of being converted to the above oxides so that the region occupied by the oxides or the compounds is smaller than 0.1 μm in diameter and then, firing the mixture by heating at a temperature at which the mixture can be converted to oxides. A process for producing fine single crystal powders and a thin film capacitor are also disclosed.

6 Claims, 1 Drawing Sheet

X500

F I G. 1

X500

PROCESS FOR PRODUCING DIELECTRICS AND FINE SINGLE CRYSTAL POWDERS AND THIN FILM CAPACITOR

This application is a continuation of application Ser. No. 08/206,171, filed Mar. 7, 1994, now abandoned.

BACKGROUND OF THE INVENTION

1. Technical Field of the Invention

The present invention relates to dielectrics. More particularly, it relates to a process for producing dielectrics which are superior in insulation characteristics, low in dielectric loss and can be fired at low temperatures, and a process for producing fine single crystal powders, especially perovskite type fine single crystal powders having a uniform particle size.

The dielectrics obtained by the present invention can be applied to dielectric devices such as thin film capacitors, capacitors for DRAM, multilayer capacitors and dielectric pastes and piezoelectric parts such as actuators, resonators, filters and ultrasonic motors. The fine single crystal powders can be applied to piezoelectric parts such as actuators and pressure-sensitive sensors as piezoelectric composites and furthermore, can be applied to phosphor materials by doping of rare earth ions.

2. Prior Art

Hitherto, dielectrics such as barium titanate and lead titanate have been utilized as ceramic capacitors and filters thanks to their dielectric characteristics and piezoelectricity.

These ceramics are generally used in the multilayer form so that their capacitance can be increased. The multilayer capacitors are produced by mixing dielectric powders of 0.5–5μ obtained by solid state reaction or precipitation from a solution with a binder and a solvent to prepare a slurry, molding the slurry to a thin sheet by a tape casting method, stacking ten to several tens of the resulting thin sheets and firing them at 1200°–1300° C. In this case, however, a high firing temperature is necessary and metals relatively inexpensive and low in resistance such as silver and copper cannot be used as electrodes. In order to lower the firing temperature, it has been attempted to add a glass frit to the dielectric powders. According to this method, the firing temperature can be lowered to about 1000° C., but this is still higher than the melting point of silver (965° C.) and furthermore, when the glass frit is added in a large amount, the proportion of the crystal phase decreases, and the dielectrics decreases, the dielectric characteristics deteriorate. Moreover, since the dielectric powders and especially the glass frit are produced by grinding, a particle size of less than 1 μm can hardly be obtained. Therefore, it is difficult to attain a dense green body and thus it is difficult to obtain a film of thin thickness. That is, when a dielectric thin film is prepared by a tape casting method using dielectric powders obtained by the solid or liquid phase process, it is difficult to reduce the film thickness of the dielectrics to less than 20μ because of the large particle size of the resulting dielectric powders.

The electrostatic capacitance of capacitors has the following relation:

$$C = \varepsilon_0 \varepsilon_r \frac{S}{d} n$$

(wherein C indicates the electrostatic capacitance, S indicates the area, d indicates the distance between electrodes, $\varepsilon_0$ indicates the vacuum dielectric constant, $\varepsilon_r$ indicates the relative dielectric constant, and n indicates the number of the multilayers). That is, for making multilayer ceramic capacitors of small size and high capacitance, the number of layers should be increased since the area and the thickness have limitations. However, in the case of the abovementioned method in which the thickness of the dielectric layer is large, the attainable capacitance has limitation. As an attempt to solve this problem, it has been proposed to thin the dielectric layers. One layer of the multilayer capacitor has a thickness of about 20–40μ and if the thickness can be reduced to about 1–5μ, a large capacitance can be obtained and moreover, the capacitor can be miniaturized. As the method for making a thinner dielectric layer, in addition to the tape casting method and printing method, there are vapor phase methods such as a sputtering method, vacuum evaporation method and CVD method. Furthermore, there are a sol-gel method and a method of producing dielectric thin films by coating and thermal decomposition of organometallic compounds. However, because of the thin thickness, shortcircuitting is apt to occur and leakage of current is large. It has also been known to use a ferroelectric glass-ceramics for obtaining a dense molded sheet.

Generally, the dielectric powders are produced as powders of 0.5–5 μm by the solid state reaction conducted by firing the powders of oxides, carbonates or the like at high temperatures or by co-precipitation process comprising the reaction in an aqueous solution. In both of these reactions, the resulting powders comprise secondary particles formed by agglomeration of primary particles and there are problems in uniformity of the composition and crystallinity. In order to solve these problems, the hydrothermal synthesis has been proposed, but this process needs high temperatures and high pressures, resulting in increase of cost in view of cost of the equipment and productivity. As an alternative process, use of glass-ceramics is also proposed.

The process of using the glass-ceramics comprises blending the compounds in such a composition that a glass can be formed, melting the blend at a high temperature of about 1400° C., quenching the melt to obtain a glass and then, heat treating the glass at 600°–800° C. to crystallize it. This process is not restricted by the size of the initial particles and dielectric thin films can be produced. Furthermore, due to its denseness, a low dielectric loss and a high dielectric strength can be realized. Fine single crystals can be obtained by dissolving a glass phase from this glass-ceramics. However, the composition capable of being vitrified is extremely limited and it is considerably difficult to increase the proportion of the crystal phase of high dielectric constant to more than 30%. Therefore, high dielectric constant cannot be obtained.

SUMMARY OF THE INVENTION

The present invention provides glass-ceramics which are superior in insulation, exhibit the characteristics of the crystal phase of high dielectric constant and have a dense structure at lower temperatures than crystal phase alone and a process for producing the glass-ceramics, and a process for producing perovskite fine single crystal powders having a uniform composition, a high crystallinity and a uniform particle size utilizing the above glass-ceramics at lower temperatures.

Under the circumstances, the inventors have conducted intensive research on a process for producing dielectrics low in dielectric loss and high in insulation characteristics, and on fine single crystal powders obtained therefrom. As a result, the present invention has been accomplished.

That is, the present invention relates to a process for producing dielectrics, characterized by mixing an oxide of X (X is at least one element selected from Li, Na, K, Pb, Ba, Mg, Ca, Sr, La, Y and Bi), an oxide of M (M is at least one element selected from Al, Mn, Ti, Zr, Sn, Mg, Zn, Fe, Co, Ni, Nb, Ta and W), an oxide of G (G is at least one element selected from B, As, Sb, Si, Ge, Te and P) or compounds capable of being converted to these oxides so that the resulting mixture satisfies the formula $wXMO_3$—$(1-w)$ $(XO_y$—$aGO_z)$ and so that the rigon occupied by the oxides or the compounds is smaller than 0.1 $\mu m$ in diameter and then, heating and firing the mixture at a temperature at which the mixture can be converted to oxides (in the formula, y and z represents the number of oxygen, and when X is Li, Na and K, y=0.5, when X is Pb, Ba, Mg, Ca or Sr, y=1, and when X is La, Y or Bi, y=1.5, and when G is B, As or Sb, z=1.5, when G is Si, Ge or Te, z=2 and when G is P, z=2.5, w represents a mol number, a is a real number and $0.3 < w \leq 0.95$ and $1/19 < a \leq 2$ with a proviso that when X is only Pb, M is at least one element selected from Zr and Ti, $0.3 < w < 0.95$ and $1/19 < a \leq 1$, when X is only Ba, M is at least one element selected from Zr, Ti and Sn, $0.4 \leq w \leq 0.95$ and $1/19 \leq a \leq 2$).

DESCRIPTION OF THE INVENTION

Figure 1:
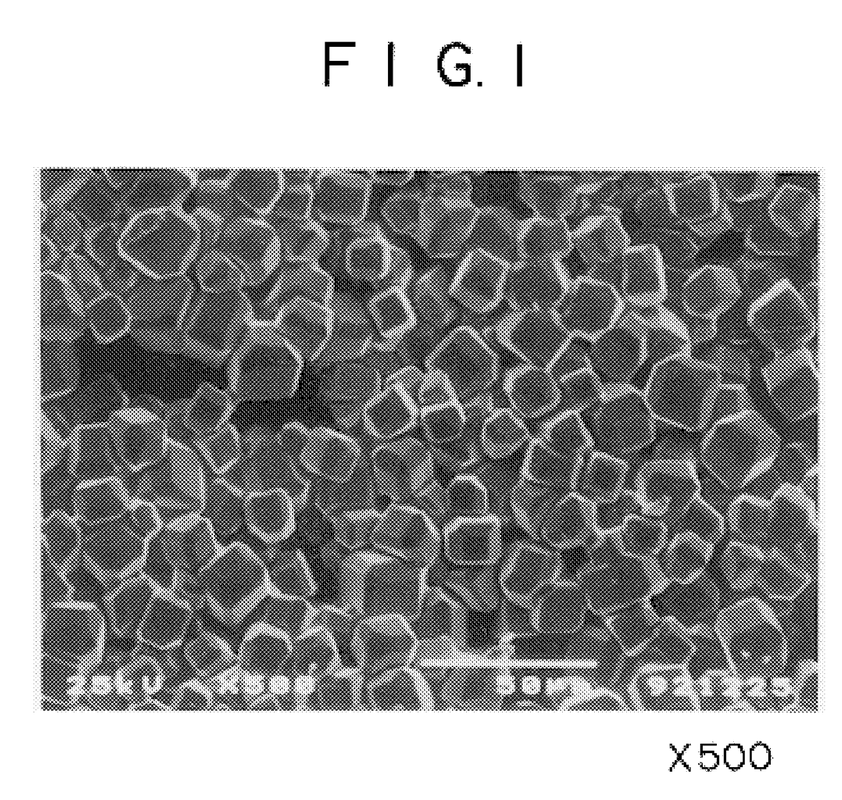
FIG. 1 is a scanning electron micrograph (x 500) of single crystal powders obtained by firing the gel powder (w=0.7) of Example 2 at 1100° C. for 1 minute. The scale is shown in the photograph.

The present invention will be explained in detail.

The present invention relates to a process for producing dielectrics, characterized by mixing a compound X [X is at least one element selected from Pb, Ba, Li, Na, K, Mg, Ca, Sr, La, Y and Bi (hereinafter referred to as "X")], a compound M [M is at least one element selected from Al, Mn, Ti, Zr, Sn, Mg, Zn, Fe, Co, Ni, Nb, Ta and W (hereinafter referred to as "M"), a compound G [G is at least one element selected from B, As, Sb, Si, Ge, Te and P (hereinafter referred to as "G") so that the resulting mixture satisfies the formula $wXMO_3$—$(1-w)(XO_y$—$aGO_z)$ and then, heating and firing the mixture at a temperature at which the mixture can be converted to oxides (in the above formula, y and z represent the number of oxygen, and when X is Li, Na and K, y=0.5, when X is Pb, Ba, Mg, Ca and Sr, y=1, and when X is La, Y and Bi, y=1.5, and when G is B, As and Sb, z=1.5, when G is Si, Ge and Te, z=2 and when G is P, z=2.5, w represents a mol number, a is a real number and $0.3 < w \leq 0.95$ and $1/19 \leq a \leq 2$ with a proviso that when X is only Pb, M is at least one element selected from Zr and Ti, $0.3 < w < 0.95$ and $1/19 < a \leq 1$, when X is only Ba, M is at least one element selected from Zr, Ti and Sn, $0.4 \leq w \leq 0.95$ and $1/19 \leq a \leq 2$).

w shows the proportion of the dielectric crystal phase and if w is less than 0.3, the desired dielectric characteristics cannot be obtained and if it is more than 0.95, the crystal phase is produced with difficulty and a high temperature is required. Furthermore, in order that the crystallite size and the crystallization temperature are controlled to desired ones, w can be in the above range.

y is ½ of the total valence obtained by multiplying the valence of each ion constituting the X by the mol fraction of each ion in view of necessity for electrical neutrality. z represents the mol number of the glass phase-forming oxide in terms of the element. For example, in the case of boric acid ($B_2O_3$), $BO_{1.5}$ is 1 mol, in the case of $P_2O_5$, $PO_{2.5}$ is 1 mol, and in the case of $SiO_2$, $SiO_2$ is 1 mol.

a represents a molar ratio of the element X to the element G present in the glass phase and is preferably from 1/19 to 2, more preferably from 1/9 to 1. If a is less than 1/19, X escapes from the compounds in the crystal phase to cause decrease in the amount of the crystal phase and if it is more than 2, an excessive XO precipitates and the crystal phase also decreases.

As the method for mixing the starting compounds so that the rigion occupied by each of the compounds is smaller than about 0.1 $\mu m$ (hereinafter referred to as "scale of smaller than about 0.1 $\mu m$"), mention may be made of, for example, vacuum methods such as sputtering, CVD and vacuum evaporation, a method of using metallic compounds soluble in organic solvents, a method of using colloidal sol such as colloidal silica, and a method of using metallic compounds soluble in water.

As the starting materials, in the case of the sputtering, there may be optionally used the oxides corresponding to the compositions, namely, the targets such as PbO, BaO, $Li_2O$, $Na_2O$, $K_2O$, MgO, CaO, SrO, $Al_2O_3$, $MnO_2$, $TiO_2$, $ZrO_2$, $SnO_2$, ZnO, FeO, CoO, NiO, $Nb_2O_5$, $Ta_2O_5$, $W_2O_5$, $La_2O_3$, $Y_2O_3$, $B_2O_3$, $As_2O_3$, $Sb_2O_3$, $SiO_2$, $GeO_2$, $TeO_2$ and $P_2O_5$. There are the multi target sputtering in which the composition and the film thickness are controlled depending on the sputtering time of the respective target and the method of using a target of a dielectric prepared by previously mixing the starting materials in the desired composition and sintering the mixture.

In the case of the CVD method, the compound X as a starting material includes, for example, lithium compounds such as an alkyl lithium; sodium compounds such as an alkyl sodium; potassium compounds such as an alkyl potassium; organolead compounds such as tetraethyl lead and bisdipivaloylmethnatolead or lead halides such as lead chloride; organic barium compounds such as barium ethoxide, barium isopropoxide and bisdipivaloyl barium or barium halides such as barium chloride; organomagnesium compounds such as magnesium ethoxide, magnesium isopropoxide and bisdipivaloylmagnesium or magnesium halides such as magnesium chloride; organocalcium compounds such as calcium ethoxide, calcium isopropoxide and bisdipivaloylcalcium or calcium halides such as calcium chloride; organostrontium compounds such as strontium ethoxide, strontium isopropoxide and bisdipivaloylstrontium or strontium halides such as strontium chloride; organolanthanum compounds such as lanthanum ethoxide, lanthanum acetylacetonate and bisdipivaloyllanthanum or lanthanum halides such as lanthanum chloride; organoyttrium compounds such as yttrium ethoxide, yttrium acetylacetonate and trisdipivaloylyttrium or yttrium halides such as yttrium chloride; organobismuth compounds such as bismuth ethoxide, bismuth acetylacetonate and or bismuth halides such as bismuth chloride.

In the case of the CVD method, the compound M as a starting material includes, for example, aluminum compounds such as trimethylaluminum, triethylaluminum and aluminum triisopropoxide or aluminum halides such as aluminum chloride; manganese compounds such as manganese acetylacetonate; organotitanium compounds such as titanium ethoxide, titanium isopropoxide, titanium butoxide and titanium acetate or titanium halides such as titanium tetrachloride; organozirconium compounds such as zirconium ethoxide, zirconium isopropoxide and zirconium butoxide or zirconium halides such as zirconium tetrachloride; organotin compounds such as tetraethyltin, tetrabutyltin, tin ethoxide, tin isopropoxide and tin butoxide; organomagnesium compounds such as magnesium ethoxide, magnesium isopropoxide and bisdipivaloylmagnesium or magnesium halides such as magnesium chloride; organozinc compounds such as zinc ethoxide, zinc acetylacetonate and bisdipivaloylzinc or zinc halides such as zinc chloride; organoiron compounds such as iron ethoxide, iron acetylacetonate and bisdipivaloyliron or iron halides such as iron chloride; organocobalt compounds such as cobalt ethoxide, cobalt acetylacetonate and bisdipivaloylcobalt or cobalt halides such as cobalt chloride; organonickel compounds such as nickel ethoxide, nickel acetylacetonate and bisdipivaloylnickel or nickel halides such as nickel chloride; organoniobium compounds such as niobium ethoxide, niobium acetylacetonate and bisdipivaloylniobium or niobium halides such as niobium chloride; organotantalum compounds such as tantalum ethoxide and tantalum acetylacetonate or tantalum halides such as tantalum chloride; and organotungsten compounds such as tungsten ethoxide and tungsten acetylacetonate or tungsten halides such as tungsten chloride.

In the case of the CVD method, the compound G as a starting material includes, for example, boron compounds such as borane, triethylboron and trimethylboron; arsenic compounds such as arsine, triethylarsenic and trimethylarsenic; antimony compounds such as triethylantimony and trimethylantimony; silicon compounds such as silane, disilane, tetramethylsilane, tetraethylsilane, silicon tetrachloride, tetraethoxysilane and tetramethoxysilane; germanium compounds such as germanium hydride, tetramethylgermanium, tetraethylgermanium, germanium tetrachloride, tetraethoxygermanium and tetramethoxygermanium; tellurium compounds such as tellurium hydride, tetramethyltellurium, tetraethyltellurium, tellurium tetrachloride, tetraethoxytellurium and tetramethoxytellurium; and phosphorus compounds such as phosphorus oxychloride.

These compounds are mixed to satisfy the formula $wXMO_3—(1—w)(XO_y—aGO_z)$ (wherein y and z represent the number of oxygen, and when X is Li, Na and K, y=0.5, when X is Pb, Ba, Mg, Ca and Sr, y=1, and when X is La, Y and Bi, y=1.5, and when G is B, As and Sb, z=1.5, when G is Si, Ge and Te, z=2 and when G is P, z=2.5, w represents a mol number, a is a real number and $0.3<w\leq0.95$ and $\frac{1}{19}\leq a \leq 2$ with a proviso that when X is only Pb, M is at least one element selected from Zr and Ti, $0.3<w<0.95$ and $\frac{1}{19}<a\leq1$, when X is only Ba, M is at least one element selected from Zr, Ti and Sn, $0.4\leq w\leq 0.95$ and $\frac{1}{19}\leq a\leq 2$) and the mixture is transferred together with a gas such as argon, nitrogen, oxygen or the like and precipitated on a substrate or in a reaction vessel.

As the mixing method, the customary method which comprises vaporizing the compounds by separate vaporizers and mixing the vaporized compounds midway through the piping is superior in controllability. However, all of the starting compounds as those having nearly the same vapor pressure may be previously mixed and then they may be vaporized.

The flow rate of the gas is between about 100 cc/min and about 10 liters/min which depends on the production rate.

The reaction vessel may be any of those which are corrosion resistant and in which the gases can be mixed under airtight condition.

The wall of the reaction vessel or the substrate may be heated to 300–900° C. and when it is heated the crystal phase is directly deposited. When it is not heated, since the product is generally amorphous, the thin film or powders are taken out from the CVD apparatus and then heated for the crystallization.

The thus obtained thin film or powders can be fired by known means such as electric-resistance heating, plasma heating, high-frequency heating and laser heating. The firing temperature may vary depending on the production method and in the case of the CVD method, a heat treatment of about 200–900° C. may be employed.

In the case of the vacuum evaporation, the simple metals such as Pb, Ba, Li, Na, K, Mg, Ca, Sr, Ti, Zr, Sn, Mg, Zn, Fe, Co, Ni, Nb, B, As, Sb, Si, Ge and Te or an alloy of these metals mixed so as to give the desired composition mentioned hereabove are heated by tungsten boat or electron beam to deposit the composition on a substrate.

In the method of using a metallic compound soluble in organic solvents, for example, the following compounds can be used as the compound X.

Lithium compounds such as ethoxylithium, isopropoxylithium, butoxylithium, lithium acetate and lithium acetylacetonate; sodium compounds such as methoxysodium, ethoxysodium, isopropoxysodium, butoxysodium, sodium acetate and sodium acetylacetonate; potassium compounds such as methoxypotassium, ethoxypotassium, isopropoxypotassium, butoxypotassium, potassium acetate and potassium acetylacetonate; lead compounds such as diethoxylead, diisopropoxylead, dimethoxyethoxylead, lead acetylacetonate, lead formate and lead acetate; barium compounds such as dimethoxybarium, diethoxybarium, diisopropoxybarium, dibutoxybarium, barium acetate and barium acetylacetonate; magnesium compounds such as dimethoxymagnesium, diethoxymagnesium, diisopropoxymagnesium and dibutoxymagnesium; calcium compounds such as dimethoxycalcium, diethoxycalcium, diisopropoxycalcium and dibutoxycalcium; strontium compounds such as dimethoxystrontium, diethoxystrontium, diisopropoxystrontium and dibutoxystrontium; lanthanum compounds such as triethoxylanthanum, triisopropoxylanthanum, tributoxylanthanum and lanthanum chloride; yttrium compounds such as triethoxyyttrium, triisopropoxyyttrium, tributoxyyttrium and yttrium chloride; bismuth compounds such as trimethoxybismuth, triethoxybismuth, triisopropoxybismuth, tributoxybismuth and bismuth chloride.

In the method of using a metallic compound soluble in organic solvents, for example, the following compounds can be used as the compound M.

Aluminum compounds such as trimethylaluminum, triethylaluminum and aluminum triisopropoxide or aluminum halides such as aluminum chloride; manganese compounds such as manganese acetylacetonate; titanium compounds such as tetramethoxytitanium, tetraethoxytitanium, tetraisopropoxytitanium, tetrabutoxytitanium and titanium tetrachloride; zirconium compounds such as tetramethoxyzirconium, tetraethoxyzirconium, tetraisopropoxyzirconium, tetrabutoxyzirconium and zirconium tetrachloride; tin compounds such as tetramethoxytin, tetraethoxytin, tetraisopropoxytin, tetrabutoxytin, tetraoctyltin, tin acetylacetonate and tin tetrachloride; magnesium compounds such as dimethoxymagnesium, diethoxymagnesium, diisopropoxymagnesium and dibutoxymagnesium; zinc compounds such as dimethoxyzinc, diethoxyzinc, diisopropoxyzinc, dibutoxyzinc, zinc acetylacetonate and zinc chloride; iron compounds such as triethoxyiron, tributoxyiron, iron acetylacetonate and iron chloride; cobalt compounds such as diethoxycobalt, dibutoxycobalt, cobalt acetylacetonate and cobalt chloride; nickel compounds such as diethoxynickel, dibutoxynickel, nickel acetylacetonate and nickel chloride; niobium compounds such as pentamethoxyniobium, pentaethoxyniobium, pentaisopropoxyniobium, pentabutoxyniobium and niobium chloride; tantalum compounds such as pentamethoxytantalum, pentaethoxytantalum, pentaisopropoxytantalum, pentabutoxytantalum and tantalum chloride; and tungsten compounds such as pentamethoxytungsten, pentaethoxytungsten, pentaisopropoxytungsten, pentabutoxytungsten and tungsten chloride.

In the method of using a metallic compound soluble in organic solvents, for example, the following compounds can be used as the compound G.

Boron compounds such as triethyl borate, trimethyl borate, trimethoxyethoxyboron, triphenyl borate and boric acid; arsenic compounds such as triethyl arsenate, trimethyl arsenate, trimethoxyethoxyarsenic and triphenyl arsenate; antimony compounds such as triethyl antimonate, trimethyl antimonate, trimethoxyethoxyantimony and triphenyl antimonate; silicon compounds such as tetramethoxysilane, tetraethoxysilane, tetraisopropoxysilane, tetrabutoxysilane and silicon tetrachloride; germanium compounds such as tetramethoxygermanium, tetraethoxygermanium, tetraisopropoxygermanium, tetrabutoxygermanium and germanium tetrachloride; tellurium compounds such as tetramethoxytellurium, tetraethoxytellurium, tetraisopropoxytellurium, tetrabutoxytellurium and tellurium tetrachloride; and phosphorus compounds such as trimethoxyphosphonyl and phosphorus chloride.

As the organic solvents, there may be used any of those which can dissolve the above-mentioned lithium compounds, sodium compounds, potassium compounds, lead compounds, barium compounds, magnesium compounds, calcium compounds, strontium compounds, lanthanum compounds, yttrium compounds, bismuth compounds, aluminum compounds, manganese compounds, titanium compounds, zirconium compounds, tin compounds, zinc compounds, iron compounds, cobalt compounds, nickel compounds, niobium compounds, tantalum compounds, tungsten compounds, boron compounds, arsenic compounds, antimony compounds, silicon compounds, germanium compounds, tellurium compounds, phosphorus compounds and the like. Of the organic solvents, preferred are alcohols such as methanol, ethanol, propanol, butanol, pentanol, methoxyethanol and ethoxyethanol, aromatic hydrocarbons such as benzene, toluene and xylene, aliphatic hydrocarbons such as pentane, hexane, heptane and octane, ethers such as dioxane and tetrahydrofuran, ketones such as acetone, methyl ethyl ketone and diethyl ketone, carboxylates such as methyl acetate, ethyl acetate and ethyl formate, β-diketones such as acetylacetone, benzoylacetone and dibenzoylacetone, and amides such as dimethylformamide and dimethylacetamide. These organic solvents can be used each alone or in combination of two or more.

The solution of the compounds can be prepared by dissolving the compound X, the compound M and the compound G in the organic solvents and mixing the resulting solutions at room temperature or by allowing the compounds to react with each other in the organic solvent with heating. When a film is produced from the solution, it is sometimes necessary to carry out polymerization of the coating solution to improve quality of the coating film. In this case, there may be added a suitable amount of water or a solution prepared by diluting the organic solvent with water at a suitable ratio during the mixing or the reaction.

The temperature for heating the compounds in the organic solvents varies depending on the kind of the compounds, but is usually 60–150° C. and normally, the reaction vessel is heated using a jacket.

The concentration of the metallic compound in the solution used in the present invention may vary depending on the kind of the metallic compound, but if the solution is diluted too much, a large amount of the solvent is needed and this is uneconomical. The concentration is generally 5–80% by weight, preferably 10–50% by weight in terms of oxide.

Carboxylic acids ($C_6$–$C_{20}$), glycols, amines and the like can be added to the solution of the compound for the purpose of stabilization.

Furthermore, polymeric materials such as polyols and ethylcellulose, high-boiling compounds such as methyl cellosolve, ethyl cellosolve, acetylacetone and glycerine, nonionic or anionic surfactants and the like can be added to improve workability of the solution.

The method for molding the thus obtained solution or colloidal sol obtained by partial hydrolysis of the solution includes, for example, a method of forming a film on a substrate and a method of molding into a bulk. Furthermore, it is also possible to obtain powders by drying or hydrolyzing the solution.

The formation of the film on a substrate can be carried out by known coating methods such as dip coating, spray coating, spinner coating and brushing. If necessary, the resulting thin film is further dried.

When the solution is molded in the form of bulk, it can be molded by known methods such as slip casting, colloidal pressing and tape casting. Alternatively, the thus prepared solution is further hydrolyzed with an excess amount of water and dried, and the resulting powders are, if necessary, ground and calcined and then molded by dry pressing, slip casting, tape casting or the like.

The hydrolysis can be carried out by reacting the solution of the compound with water or a solution containing water in excess of at least twice of the mol number of the metal contained in the solution or may be reacted with water in the air merely by leaving the solution in the air.

In the method of using colloidal sols, the colloidal sols of the compound X (X is at least one element selected from Pb, Ba, Li, Na, K, Mg, Ca, Sr, La and Y), compound M (M is at least one element selected from Ti, Zr, Sn, Mg, Zn, Fe, Co, Ni and Nb) and compound G (G is at least one element selected from B, As, Sb, Si, Ge, Te and P) are prepared, for example, by precipitation of water-soluble salts of the metals such as chloride, nitrate, sulfate and acetate with an alkali or by ion exchange. As for the silica, commercially available silica sols (manufactured by DuPont de Nemours, E. I., Co., Nissan Chemical Industries, Ltd., Shokubai Kasei Kogyo Co., Ltd., and others) can also be used.

These colloidal sols are mixed so that the mixture satisfies the formula $wXMO_3$—$(1—w)(XO_y$—$aGO_z)$ (where y and z represent the number of oxygen, and when X is Li, Na and K, y=0.5, when X is Pb, Ba, Mg, Ca and Sr, y=1, and when X is La, Y and Bi, y=1.5, and when G is B, As and Sb, z=1.5, when G is Si, Ge and Te, z=2 and when G is P, z=2.5, w represents a mol number, a is a real number and $0.3<w\leqq0.95$ and $1/19\leqq a\leqq2$) and the mixture is molded as it is or is allowed to gel and then molded. Similarly, powders can also be obtained by gelation. Furthermore, a precipitate may be obtained by adjustment of pH.

As a method for gelation, the first one is drying. In general, a sol loses repulsive force and gels when the dispersion medium disappears. The drying method can be applied to all sols. Furthermore, the sol can also be allowed to gel by restraining the Coulomb repulsive force with adjustment of pH or addition of salts. An acidic sol gels in the neutral-alkaline region with addition of, for example, ammonia or sodium hydroxide and an alkaline sol gels in the neutral-acidic region with addition of an acid, for example, hydrochloric acid or nitric acid. Furthermore, when the concentration of electrolyte in the aqueous colloid solution is increased by adding a salt such as potassium chloride, calcium chloride or aluminum nitrate, the Coulomb repulsive force is hidden and reduced to cause gelation. The gelation can also be brought about by adding an organic solvent such as isopropanol or acetone.

The thus obtained gel or precipitate is dried and/or calcined to obtain powders having such a proper size that the region occupied by each of the compounds X, M and G is smaller than 0.1 μm and the powders can be used as a raw material for paste or molded by known methods.

The method for molding includes, for example, a method of coating as a coating solution on a substrate to forming a film and a method of molding into a bulk.

The formation of the film on a substrate can be carried out by known coating methods such as dip coating, spray coating, spinner coating and brushing. If necessary, the resulting thin film is further dried.

When molded in the form of bulk, the solution of the compound can be molded by known methods such as slip casting, colloidal pressing and tape casting. Alternatively, the gel powders obtained as mentioned above are, if necessary, ground and calcined, and then molded by dry pressing, slip casting, tape casting or the like.

In the method of obtaining the mixture by mixing the metallic compounds soluble in water and, if necessary, coprecipitating them, for example, the following compounds can be used as the compound X.

Lithium compounds such as lithium nitrate, lithium acetate and lithium chloride; sodium compounds such as sodium nitrate, sodium acetate and sodium chloride; potassium compounds such as potassium nitrate, potassium acetate and potassium chloride; lead compounds such as lead nitrate, lead acetate and lead chloride; barium compounds such as barium nitrate, barium acetate and barium chloride; magnesium compounds such as magnesium nitrate, magnesium acetate and magnesium chloride; calcium compounds such as calcium nitrate, calcium acetate and calcium chloride; strontium compounds such as strontium nitrate, strontium acetate and strontium chloride; lanthanum compounds such as lanthanum nitrate, lanthanum acetate and lanthanum chloride; yttrium compounds such as yttrium nitrate, yttrium acetate and yttrium chloride; and bismuth compounds such as bismuth nitrate, bismuth acetate and bismuth chloride.

As the compound M soluble in water, mention may be made of, for example, the following compounds.

Aluminum compounds such as aluminum nitrate, aluminum acetate, aluminum chloride and aluminum sulfate; manganese compounds such as manganese nitrate, manganese acetate and manganese chloride; titanium compounds such as titanyl nitrate, titanyl acetate, titanium tetrachloride and titanyl sulfate; zirconium compounds such as zirconyl nitrate, zirconyl acetate, zirconium tetrachloride and zirconyl sulfate; tin compounds such as tin nitrate, tin acetate, tin tetrachloride and tin dichloride; magnesium compounds such as magnesium nitrate, magnesium acetate and magnesium chloride; zinc compounds such as zinc nitrate, zinc acetate, zinc chloride and zinc sulfate; iron compounds such as iron nitrate, iron acetate, iron chloride and iron sulfate; cobalt compounds such as cobalt nitrate, cobalt acetate, cobalt chloride and cobalt sulfate; nickel compounds such as nickel nitrate, nickel acetate, nickel chloride and nickel sulfate; niobium compounds such as niobium nitrate, niobium acetate, niobium chloride and niobium sulfate; tantalum compounds such as tantalum nitrate, tantalum acetate, tantalum chloride and tantalum sulfate; and tungsten compounds such as tungsten nitrate, tungsten acetate, tungsten chloride and tungsten sulfate.

As the compound G soluble in water, mention may be made of, for example, the following compounds.

Boron compounds such as boric acid; arsenic compounds such as arsenic acid; antimony compounds such as antimonic acid, antimony nitrate, antimony acetate, antimony chloride and antimony sulfate; silicon compounds such as silicon tetrachloride and silicic acid; germanium compounds such as germanium tetrachloride, germanium nitrate and germanium acetate; tellurium compounds such as tellurium tetrachloride and tellurium nitrate; and phosphorus compounds such as phosphoric acid.

The above compounds soluble in water are mixed so that the mixture satisfies the formula $wXMO_3$—$(1-w)(XO_y$—$aGO_z)$ (where y and z represents the number of oxygen, and when X is Li, Na and K, y=0.5, when X is Pb, Ba, Mg, Ca and Sr, y=1, and when X is La, Y and Bi, y=1.5, and when G is B, As and Sb, z=1.5, when G is Si, Ge and Te, z=2 and when G is P, z=2.5, w represents a mol number, a is a real number and $0.3 < w \leq 0.95$ and $1/19 \leq a \leq 2$).

The method for molding the thus obtained solution, includes, for example, a method of forming a film by coating the solution on a substrate and a method of molding the solution into a bulk.

Furthermore, a precipitate is obtained by adjusting pH of the solution or by producing insoluble salts and the precipitate is dried and/or calcined to obtain powders of such a proper size that the region occupied by each of the compounds X, M and G is smaller than 0.1 μm. The powders are used as a raw material for paste or the powders can be molded into a desired shape by slip casting or dry pressing.

The pH for producing the precipitate varies depending on the metals, but is generally 3 or more, preferably around neutral. However, in the case of alkaline earth metal ions such as Mg, a pH of 11 or higher is necessary and alkali metal ions do not precipitate by the pH adjustment. Therefore, in the case of alkaline earth metal ions, it is preferable to form insoluble salts and the precipitate is produced with addition of oxalic acid, sulfuric acid, citric acid or the like. Alkali metal ions are precipitated by removing water from the system to cause decrease of solubility thereof.

The formation of a film on a substrate can be carried out by known coating methods such as dip coating, spray coating, spinner coating and brushing. If necessary, the resulting thin film is further dried.

The drying of the powders thus obtained by the above-mentioned methods can be carried out using known drying means such as rotary evaporator, flaker and air bath. The drying temperature is about 100–300° C. when known air oven and the like are used.

The powders can be fired using known means such as electric resistance heating, plasma, high-frequency and laser. The firing temperature depends on the composition, but it must be higher than the crystallization temperature of the crystal phase and is normally 400–1200° C., preferably 500–1000° C. If the firing temperature is lower than 400° C., the organic matters do not decompose or the crystallization does not proceed and if it is higher than 1200° C., the composition varies due to the evaporation of elements and this is not preferred.

The firing atmosphere can be an air atmosphere, an inert gas atmosphere or a reducing atmosphere, and furthermore, the firing can be carried out in an oxygen atmosphere when the crystal phase is reduced with ease.

The thus obtained powders are properly ground by known methods such as ball mill, oscillating mill, mortar and attrition mill, and they are used as raw materials for paste or molded by known methods such as dry pressing, cold isotactic pressing and slip casting.

The thus obtained powders comprise a mixture of many precipitated fine single crystals and the glass component. Separation of only the fine single crystals from the mixture can be carried out by dissolving the glass component in water, an aqueous dilute acid solution, an aqueous dilute alkali solution or the like, followed by carrying out filtration, centrifugation or the like. The acid includes, for example, nitric acid, hydrofluoric acid, hydrochloric acid, sulfuric acid and acetic acid. The alkali includes, for example, aqueous ammonia, sodium hydroxide and potassium hydroxide. These are diluted to a concentration of 5–50% and used.

The substrate used in the present invention can be any of those which have smoothness and heat resistance required in the heat treatment in the course of the process. Examples of the substrate are glass substrate, ceramic substrate, glass or ceramic substrate covered with a metallic thin film or an electrically conductive oxide, metallic foil and semiconductive substrate.

As specific examples, mention may be made of substrates of silica glass, alumina, zirconia, mica, silicon and the like, substrates of silica glass, alumina, zirconia, mica, silicon and the like which are covered with a thin film of gold, platinum, palladium, silver, copper, chromium, titanium, aluminum, tantalum, gold-chromium, palladium-silver, platinum-tantalum, platinum-titanium, tin or antimony-doped indium oxide or the like, and metallic substrates of gold, platinum, palladium, silver, copper, nickel, nickel-chromiumm, aluminum and the like.

Heating of the film coated on a substrate or the molded products obtained as mentioned above can be performed by known means such as electric resistance heating, plasma, high-frequency and laser. The heating temperature may vary depending on the production method, but in the case of sputtering method and CVD method, the film is formed with heating the substrate to about 200–700° C. without additional heating treatment or with additional heat treatment at about 500–900° C.

In the case of the vacuum evaporation, the heat treatment is generally carried out at about 500–900° C. in the air or in an oxidizing atmosphere.

In the case of the method which uses the metallic compounds soluble in organic solvents, the metallic compounds soluble in water or the colloidal sols, though it depends on the concentration of the metallic compounds in the solvent, the kind of the solvent and the kind of the substrate, the heating temperature must be higher than the crystallizing temperature of dielectrics, and is usually about 400–1200° C., preferably about 500–1000° C. If the heating temperature is lower than 400° C., the organic matters do not decompose or crystallization does not proceed and if it is higher than 1200° C., the composition varies due to the evaporation of the elements and this is not preferred.

The bulk powders and molded products are subjected to sintering at 500–1000° C. as a heat treatment to sinter them densely though the temperature depends on the composition.

The heat treating atmosphere can be an air atmosphere, an inert gas atmosphere or a reducing atmosphere or the heat treatment can be carried out in an oxygen atmosphere when the dielectrics are reduced with ease.

The following examples are illustrative of the present invention and are not intended for purposes of limitation. The dielectric characteristics were measured in the following manner. That is, one hundred Au electrodes were formed on the dielectric film by sputtering and the dielectric characteristics were measured by an impedance analyzer (YHP4275A manufactured by Yokogawa Hewlett Packard Co., Ltd.). The insulation was evaluated in terms of the number of the electrodes which did not shortcircuit among the one hundred electrodes.

Furthermore, the dielectric breakdown voltage was measured using a high-insulation resistance tester (YHP4329A manufactured by Yokogawa Hewlett Packard Co., Ltd.) by application of a direct voltage.

Moreover, crystal phase was identified by X-ray powder diffraction and the crystal form was determined by a scanning electron microscope.

EXAMPLE 1

Lead diethoxide, titanium tetraisopropoxide and tetra-ethoxysilane were mixed at the ratio as shown in Table 1 in terms of $wPbTiO_3$—$(1-w)(PbO-SiO_2)$ and dissolved in a mixed solvent of isopropanol-toluene (1:1 in weight ratio) to prepare a stock solution which had a concentration of 15% by weight in terms of the oxides for production of dielectrics.

The solution was coated on an Si substrate covered with a Pt/Ti (0.5/0.05 $\mu$m) layer by a spinner under the condition of 2500 revolutions and then, fired at 450° C. for 30 minutes in oxygen. These coating and firing were repeated three times. Finally, the coating was fired at 700° C. for 1 hour in the air to obtain a dense and transparent dielectric thin film having a film thickness of 0.5 $\mu$m.

Results of the evaluation are shown in Table 1. The formation of $PbTiO_3$ was confirmed by X-ray diffraction. Formation of crystals was recognized in all of the compositions, but crystallization was insufficient when w=1 and the amount of the crystal phase was small when w=0.3. Moreover, densification of the film was insufficient when w=1.

TABLE 1

| w | Dielectric constant | Dielectric loss (%) | Insulation resistance ($\Omega$) | Insulation (%) |
|---|---|---|---|---|
| 1 | 150 | 1.9 | $1 \times 10^8$ | 60 |
| 0.95 | 280 | 3.5 | $1 \times 10^{10}$ | 96 |
| 0.90 | 220 | 3.0 | $1 \times 10^{10}$ | 100 |
| 0.60 | 140 | 2.5 | $1 \times 10^{11}$ | 100 |
| 0.50 | 90 | 1.5 | $1 \times 10^{12}$ | 100 |
| 0.30 | 40 | 1.0 | $1 \times 10^{12}$ | 100 |

EXAMPLE 2

Lead diethoxide, titanium tetraisopropoxide and trimethyl borate were mixed at the ratio as shown in Table 1 in terms of $wPbTiO_3$—$(1-w)(PbO-0.25B_2O_3)$ and dissolved in a mixed solvent of isopropanol-toluene (1:1 in weight ratio) to prepare a solution for production of a fine single crystal powder which had a concentration of 15% by weight in terms of the oxide. The solvent was removed from the solution by a rotary evaporator and then the solution was dried at 130° C. for 30 minutes to obtain a gel powder. The gel powder was kept at 800° C. for 1 hour to precipitate fine single crystals. Furthermore, the fired powder was washed with 1N nitric acid at 40° C. and filtrated to obtain only the fine single crystals. The formation of the crystal phase was confirmed by X-ray diffraction. The peak height of the crystal phase (110) was employed as standard for the amount of the crystal phase produced and the crystallinity. The results are shown in Table 2. Crystallization was insufficient when w was 1. With decrease in w, the crystallinity increases, but since the amount of the crystal phase also decreases, the peak height of the crystal phase decreases when w exceeds a certain value.

TABLE 2

|  | w | Peak height of crystal phase (CPS) | Size of crystal ($\mu$m) |
|---|---|---|---|
| Comparative Example | 1 | 3700 | Not observed |
|  | 0.95 | 000 | 0.5 |
|  | 0.90 | 6500 | 1 |
|  | 0.70 | 13000 | 3 |
|  | 0.50 | 8500 | 3–10 |
| Comparative Example | 0.30 | 5000 | 3–10 |

EXAMPLE 3

0.4 mol of barium was mixed and reacted with 4 mols of methoxyethanol at 25° C. and the reaction mixture was aged at 120° C. for 2 hours. Then, the reaction mixture was cooled to 90° C. and 0.4 mol of titanium tetraisopropoxide was added thereto, followed by carrying out heating to 120° C. and then hydrolysis was carried out with addition of 0.6 mol of water dissolved in methoxyethanol (solution A). The resulting solution A was mixed, as shown in Table 3, with a solution (solution B) prepared by dissolving barium methoxyethoxide, trimethyl borate and tetraethoxysilane in methoxyethanol at a ratio of Ba:B:Si=1:a:0.5a. The composition of the solution can be expressed by $0.7BaTiO_3$-0.15 ($BaO—aB_2O_3$)-0.15($BaO$-$0.5aSiO_2$). The solution was dried by a rotary evaporator to obtain a gel powder. The gel powder was fired at 800° C. for 30 minutes in the air to obtain an oxide powder. The oxide powder was dipped in 1N hydrochloric acid at 50° C. for 10 minutes and then subjected to centrifugation to obtain a fine crystal powder. The crystallinity of the resulting powder was measured in the same manner as in Example 1. The results are shown in Table 3. When a was 3.3 or more, crystallization delayed.

TABLE 3

| a | Peak height of crystal phase (CPS) | Size of crystal ($\mu$m) |
|---|---|---|
| 3.3 | 7700 | 2–10 |
| 1.0 | 15000 | 3–5 |
| 0.2 | 12500 | 3–10 |
| 0.1 | 10000 | 2–10 |
| 0.05 | 6500 | 0.5–3 |

EXAMPLE 4

Lead diethoxide, zirconium isopropoxide, titanium tetraisopropoxide and tetraethoxygermanium were mixed so that the composition was $0.7PbZr_{0.5}Ti0.5O_3$-$0.3(PbO—GeO_2)$ and dissolved in a mixed solvent of isopropanol-toluene (1:1 in weight ratio) to prepare a solution for production of a fine single crystal powder which had a concentration of 15% by weight in terms of the oxide.

The solution was dried to obtain a gel powder. The gel powder was fired at 700° C. for 30 minutes in the air and dipped in 1N hydrochloric acid and filtrated to obtain a fine single crystal powder of 0.8 $\mu$m in particle size. The formation of PZT crystal phase was confirmed by X-ray.

EXAMPLE 5

0.25 mol of barium chloride, 0.2 mol of titanium tetrachloride, 0.02 mol of boric acid and 0.01 mol of acidic silica sol were mixed in the form of aqueous solution to obtain a gel product. The particle size of the primary particles of the gel powder obtained by drying the gel was 18 nm. The gel powder was fired at 500° C. for 3 hours to obtain an oxide powder. The oxide powder was ground in a mortar and then molded into a pellet of 10 mm in diameter and 1 mm in thickness by a pressing machine. The pellet was fired at 900° C. for 30 minutes. The electric characteristics of the pellet were measured (area of electrode: 1 mm$^2$) to obtain a dielectric constant of 980, a dielectric loss of 1.5%, an insulation of 100% and a relative density of 99%. The crystal form was observed by SEM and the formation of crystal phase was confirmed by X-ray diffraction.

As a result, fine single crystals of 5–10 $\mu$m in average particle size were observed and the formation of crystal phase was confirmed by X-ray diffraction.

EXAMPLE 6

0.5 mol of lead acetate trihydrate was dissolved in 4 mols of methoxyethanol with heating at 70° C. Then, the solution was dehydrated at 120° C. for 2 hours and cooled to 90° C. Thereto were added 0.25 mol of zirconium tetrabutoxide and 0.25 mol of titanium tetraisopropoxide and furthermore, 0.5 mol of diethanolamine. Furthermore, 0.5 mol of water dissolved in methoxymethanol was added to carry out partial hydrolysis, followed by concentration to prepare a solution for production of dielectrics (solution A) having a concentration of 0.5 mol/l in terms of Pb. The resulting solution A was added, as shown in Table 4, to a solution (solution B) prepared by dissolving lead methoxyethoxide, trimethyl borate and tetraethoxysilane in methoxyethanol so that the ratio of Pb:B:Si was 1:a:0.5a and so that the concentration of the solution was 0.5 mol/l in terms of Pb. The composition of the resulting solution can be expressed by 0.6 ($PbZr_{0.5}Ti_{0.5}O_3$)-$0.4(PbO$-$0.5aB_2O_3$-$0.5aSiO_2)$.

The resulting solution was coated on an alumina substrate covered with an Au/Ti (0.5/0.06 $\mu$m) film with adjusting the number of revolution of spinner and the number of coating so that the film thickness as shown in Table 4 was obtained and the coating was fired at 650° C. for 30 minutes in the air to obtain a transparent dielectric thin film.

The electric characteristics of the film were measured in the same manner as in Example 1. (Area of electrode: 1 mm$^2$). The results are shown in Table 4. The formation of $PbZrTiO_3$ was confirmed by X-ray diffraction. Formation of crystals in all of the compositions was recognized.

TABLE 4

| a | Dielectric constant | Dielectric loss (%) | Insulation (%) | Insulation resistance ($\Omega$) |
|---|---|---|---|---|
| 1.0 | 640 | 2.5 | 100 | 1 × 10$^{10}$ |
| 0.25 | 550 | 2.5 | 100 | 1 × 10$^{10}$ |
| 0.1 | 250 | 3 | 100 | 1 × 10$^{10}$ |

EXAMPLE 7

A thin film of 500 nm thick was formed on a titanium foil (50 $\mu$m thick) by magnetron sputtering using a sintered target having the composition of $0.6PbTiO_3$-$0.4(PbO$-$0.3B_2O_3$-$0.3SiO_2)$ and then the film was annealed at 500° C. for 5 minutes in oxygen to improve the crystallinity. Thereafter, a film of gold of 100 nm thick was formed as an upper electrode by sputtering and dielectric constant and dielectric loss were measured in the same manner as in Example 1 to obtain a dielectric constant of 200, a dielectric loss of 2% and an insulation of 100%. Thus, crystallization and high insulation at low temperatures were recognized. The formation of $PbTiO_3$ was confirmed by X-ray diffraction.

EXAMPLE 8

0.5 mol of lead acetate trihydrate was dissolved in 4 mols of methoxyethanol with heating at 70° C. Then, the solution was dehydrated at 120° C. for 2 hours and cooled to 90° C. Thereto were added 0.25 mol of zirconium tetrabutoxide and 0.25 mol of titanium tetraisopropoxide and furthermore, 0.5 mol of diethanolamine. The solution was added dropwise to methoxyethanol in which 4 mols of water was dissolved to carry out hydrolysis to obtain a colloidal sol (solution A). To the solution A was added a solution (solution B) prepared by dissolving lead acetate, boric acid and acidic silica sol in methoxyethanol so that the ratio of Pb:B:Si was 3:2:1 and so that the concentration of the solution was 0.5 mol/l in terms of Pb. The composition of the resulting solution can be expressed by $0.6(PbZr_{0.5}Ti_{0.5}O_3)$-$0.1(2PbO$—$B_2O_3)$-$0.2(PbO$—$SiO_2)$.

The resulting solution to which 0.5 wt % of ethylcellulose was added was coated on a copper sheet covered with an Ag/Ti ($0.5/0.06$ $\mu$m) film at a thickness of about 1 $\mu$m by repeating the dip coating five times. Then, the coating was fired at 650° C. for 30 minutes in the air to obtain a transparent dielectric thin film. The electric characteristics of the film were measured in the same manner as in Example 1. (Area of electrode: 1 mm$^2$). The dielectric constant was 500, the dielectric loss was 2.5% and the insulation was 100%. A sharp peak of $Pb(Zr,Ti)O_3$ was recognized by X-ray diffraction.

EXAMPLE 9

0.1 mol of lead nitrate, 0.1 mol of titanium tetrachloride and 0.2 mol of oxalic acid were simultaneously added dropwise to 500 ml of water with stirring to obtain a precipitate. This precipitate was filtered and dried to obtain titanyl lead oxalate. The particle size of the primary particles of the resulting powder was 20 nm. The powder was dispersed in an aqueous solution prepared by dissolving 0.05 mol of lead nitrate, 0.02 mol of boric acid and acidic silica sol (0.01 mol in terms of $SiO_2$) in this order and the dispersion was adjusted to pH 8 with ammonia to allow the dispersion to gel. The gel was dried to obtain a powder. The powder was fired at 500° C. for 3 hours to obtain an oxide powder. The resulting oxide powder was ground in a mortar and molded into a pellet of 10 mm in diameter and 1 mm in thickness by a pressing machine. The pellet was fired at 800° C. for 30 minutes in the air. The electric characteristics of the pellet were measured in the same manner as in Example 1. (Area of electrode: 1 mm$^2$). As a result, the dielectric constant was 180, the dielectric loss was 1.5%, the insulation was 100% and the relative density was 99%. The formation of $PbTiO_3$ was confirmed by X-ray diffraction and a very sharp peak was observed.

EXAMPLE 10

Barium ethoxide, titanium tetraisopropoxide, trimethylboron and tetraethoxysilane were mixed at the ratio as shown in Table 1 in terms of $wBaTiO_3$—$(1$—$w)(BaO$-$0.5SiO_2$-$0.5B_2O_3)$ and dissolved in a mixed solvent of isopropanol-toluene (1:1 in weight ratio) to prepare a solution for production of dielectrics which had a concentration of 15% by weight in terms of the oxide.

The solution was coated on an Si substrate covered with a Pt/Ti ($0.5/0.05$ $\mu$m) film by a spinner under the condition of 2500 revolutions and then, fired at 450° C. for 30 minutes in oxygen. These coating and firing were repeated seven times. Finally, the coating was fired at 800° C. for 5 minutes in the air to obtain a dense and transparent dielectric thin film having a thickness of 0.8 $\mu$m. The formation of crystal phase was confirmed by X-ray diffraction. The results are shown in Table 5. The insulation was insufficient when w was 1.

TABLE 5

| w | Dielectric constant | Dielectric loss (%) | Insulation resistance ($\Omega$) | Insulation (%) |
| --- | --- | --- | --- | --- |
| 1 | 600 | 5.5 | $1 \times 10^8$ | 60 |
| 0.95 | 820 | 2.0 | $1 \times 10^{10}$ | 96 |
| 0.90 | 780 | 1.5 | $1 \times 10^{10}$ | 100 |
| 0.70 | 550 | 1.5 | $1 \times 10^{11}$ | 100 |
| 0.50 | 320 | 1.3 | $1 \times 10^{12}$ | 100 |
| 0.30 | 120 | 1.2 | $1 \times 10^{12}$ | 100 |

EXAMPLE 11

0.4 mol of barium was mixed and reacted with 4 mols of methoxyethanol at 25° C. and the reaction mixture was aged at 120° C. for 2 hours. Then, the reaction mixture was cooled to 90° C. and 0.25 mol of zirconium butoxide and 0.25 mol of titanium tetraisopropoxide were added thereto, followed by carrying out heating to 120° C. to effect ester interchange. Then, 0.5 mol of diethanolamine was added and 0.4 mol of water dissolved in methoxyethanol to carry out partial hydrolysis, followed by concentration to obtain a solution for production of dielectric having a concentration of 0.5 mol/l in terms of Pb (solution A). To the resulting solution A was added a solution (solution B) prepared by dissolving barium methoxyethoxide, trimethyl borate and tetraethoxysilane in methoxyethanol so that the ratio of Ba:B:Si was 1:1:0.5 and the concentration was 0.5 mol/l in terms of Ba. The composition of the solution can be expressed by $0.7BaTiO_{0.5}Zr_{0.5}O_3$-$0.15(BaO$-$0.25B_2O_3)$-$0.15(BaO$-$0.25SiO_2)$.

The resulting solution was coated on an Si substrate covered with an Au/Ti ($0.5/0.06$ $\mu$m) film with adjusting the number of revolution of spinner and the number of coating in the same manner as in Example 10 and the resulting coating was fired at 700° C. for 30 minutes in the air to obtain a transparent dielectric thin film of 0.8 $\mu$m thick. The formation of the crystal phase was confirmed by X-ray diffraction. The electric characteristics of the film were measured (area of electrode: 1 mm$^2$) to obtain a dielectric constant of 940, a dielectric loss of 2.5%, an insulation of 100% and an insulation resistance of $10^{10}$ $\Omega$. The formation of $Ba(Zr, Ti)O_3$ was confirmed by X-ray diffraction.

EXAMPLE 12

A film of 1 $\mu$m thick was formed on a titanium foil (50 $\mu$m thick: thermal expansion coefficient $89 \times 10^{-7}$/° C.) by magnetron sputtering using a sintered target having the composition of $0.7BaTiO_3$-$0.3(BaO$-$0.33B_2O_3$-$0.33SiO_2)$ and then the film was heat treated at 700° C. for 5 minutes in oxygen to improve the crystallinity. Thereafter, a film of gold of 100 nm thick was formed as an upper electrode by sputtering and dielectric constant and dielectric loss were measured in the same manner as in Example 1 to obtain a dielectric constant of 450, a dielectric loss of 0.8% and an insulation of 100%. Thus, low dielectric loss and high insulation were recognized. The formation of the crystal phase was confirmed by X-ray diffraction.

EXAMPLE 13

The solution prepared in Example 11 was heated and dried at 120° C. in the air, ground by a ball mill using zirconia balls in toluene for 8 hours and then, dried under reduced pressure to obtain a dry gel. This was molded into a disc of 10 mm in diameter and 1 mm in thickness by a dry press and fired at 900° C. for 1 hour. Electric characteristics of this disc were measured in the same manner as in Example 1. (Area of electrode: 6 mm$^2$). The dielectric constant was 950 and the dielectric loss was 0.8%. The relative density was 99%. The formation of the crystal phase was confirmed by X-ray diffraction.

EXAMPLE 14

0.5 mol of barium isopropoxide was dissolved in 4 mols of methoxyethanol with heating at 70° C. Then, reaction was allowed to proceed at 120° C. for 2 hours and the reaction mixture was cooled to 90° C. Thereto were added 0.35 mol of zirconium tetrabutoxide and 0.15 mol of tin isopropoxide and furthermore, 0.5 mol of diethanolamine. The resultant solution was added dropwise to methoxyethanol in which 2 mols of water was dissolved to carry out hydrolysis to obtain a colloidal sol (solution A). To the solution A was added a solution (solution B) prepared by dissolving barium acetate, boric acid and acidic silica sol in methoxyethanol at the ratio of Ba:B:Si=3:2:1. The composition of the resulting solution can be expressed by $0.7Ba(Zr_{0.7}Sn_{0.3})O_3$-$0.3(BaO$-$0.33B_2O_3$-$0.33SiO_2)$.

The resulting solution to which 0.5 wt % of ethylcellulose was added was coated on a copper sheet covered with an Ag/Ti (0.5/0.06 $\mu$m) film at a thickness of about 1 $\mu$m by repeating dip coating five times. Then, the coating was fired at 650° C. for 30 minutes in the air to obtain a transparent dielectric thin film. The electric characteristics of the film were measured in the same manner as in Example 1. (Area of electrode: 1 mm$^2$). The dielectric constant was 450, the dielectric loss was 1.5% and the insulation was 100%. The formation of the crystal phase was confirmed by X-ray diffraction.

EXAMPLE 15

Lead ethoxide, strontium methoxyethoxide, titanium tetraisopropoxide, and tetraethoxysilane were mixed at the ratio as shown by $0.7(Pb_{0.5}Sr_{0.5})TiO_3$-$0.3(0.5PbO$-$0.5SrO$-$SiO_2)$ and dissolved in a mixed solvent of isopropanol-toluene (1:1 in weight ratio) to prepare a solution for production of dielectrics which had a concentration of 15% by weight in terms of the oxide.

The solution was coated on an Si substrate covered with a Pt/Ti (0.5/0.05 $\mu$m) film by a spinner under the condition of 2500 revolutions and then, fired at 450° C. for 30 minutes in oxygen. These coating and firing were repeated three times. Finally, the coating was fired at 700° C. for 5 minutes in the air to obtain a dense and transparent dielectric thin film having a film thickness of 0.5 $\mu$m. The formation of the crystal phase was confirmed by X-ray diffraction. The resultant dielectric had a dielectric constant of 320, a dielectric loss of 2.0%, an insulation of 100% and an insulation resistance of $10^{11}$ $\Omega$.

EXAMPLE 16

0.4 mol of barium was mixed and reacted with 4 mols of methoxyethanol at 25° C. and the reaction mixture was aged at 120° C. for 2 hours. Then, the reaction mixture was cooled to 90° C. and 0.25 mol of magnesium ethoxide and 0.5 mol of titanium tetraisopropoxide were added thereto, followed by carrying out heating to 120° C. to effect ester interchange. Then, 0.5 mol of diethanolamine was added and 0.4 mol of water dissolved in methoxyethanol to carry out partial hydrolysis, followed by concentration to obtain a solution for production of dielectric having a concentration of 0.5 mol/l in terms of Ba (solution A). To the resulting solution A was added a solution (solution B) prepared by dissolving barium methoxyethoxide, magnesium methoxyethoxide, trimethyl borate and tetraethoxysilane in methoxyethanol so that the ratio of Ba:Mg:B:Si was 0.8:0.2:1:0.5 and so that the concentration was 0.5 mol/l in terms of Ba. The composition of the solution can be expressed by $0.7(Ba_{0.8}, Mg_{0.2})TiO_3$-$0.15(0.8BaO$-$0.2MgO)$-$B_2O_3)$-$0.15((0.8BaO$-$0.2MgO)$-$SiO_2)$.

The resulting solution was coated on an Si substrate covered with an Au/Ti (0.5/0.06 $\mu$m) film with a spinner at 2500 rpm and dried 7 times, and the resulting coating was fired at 700° C. for 30 minutes in the air to obtain a transparent dielectric thin film. The electric characteristics of this film were measured in the same manner as in Example 1. (Area of electrode: 1 mm$^2$). The formation of the perovskite crystal phase was confirmed by X-ray diffraction. The dielectric constant was 640, the dielectric loss was 1.2%, the insulation was 100% and the insulation resistance was $10^{10}$ $\Omega$.

EXAMPLE 17

A film of 1 $\mu$m thick was formed on a copper foil (50 $\mu$m thick: thermal expansion coefficient 121×10$^{-7}$/° C. ) by magnetron sputtering using a sintered target having the composition of $0.6SrTiO3$-$0.4(SrO$-$0.5B_2O_3$-$0.5SiO_2)$ and then the film was annealed at 500° C. for 5 minutes in oxygen to improve the crystallinity. Thereafter, a film of gold of 100 nm thick was formed as an upper electrode by sputtering and dielectric constant and dielectric loss were measured in the same manner as in Example 1 to obtain a dielectric constant of 150, a dielectric loss of 0.2% and an insulation of 100%. Thus, low dielectric loss and high insulation were recognized. The formation of $SrTiO_3$ was confirmed by X-ray diffraction.

EXAMPLE 18

Lead diethoxide, barium methoxyethoxide, titanium tetraisopropoxide and tetraethoxygermanium were mixed to obtain the composition shown by $0.7(Pb_{0.5}Ba_{0.5})TiO_3$-$0.3(0.5PbO$-$0.5BaO$-$GeO_2)$ and dissolved in a mixed solvent of isopropanol-toluene (1:1 in weight ratio) to prepare a solution for production of dielectrics which had a concentration of 15% by weight in terms of the oxide.

The solution was coated on an Si substrate covered with a Pt/Ti (0.5/0.05 $\mu$m) film by a spinner under the condition of 2500 revolutions and then, fired at 450° C. for 30 minutes in oxygen. These coating and firing were repeated three times. Finally, the coating was fired at 700° C. for 5 minutes in the air to obtain a dense and transparent dielectric thin film having a thickness of 0.8 $\mu$m. The electric characteristics of the resultant dielectric were measured to obtain a dielectric constant of 1000, a dielectric loss of 1.5%, and an insulation resistance of $2 \times 10^{10}$ Ω. The formation of the crystal phase was confirmed by X-ray diffraction.

EXAMPLE 19

0.35 mol of strontium isopropoxide was dissolved in 4 mols of methoxyethanol with heating at 70° C. Then, reaction was allowed to proceed at 120° C. for 2 hours and the reaction mixture was cooled to 90° C. Thereto were added 0.5 mol of zirconium tetrabutoxide and 0.15 mol of barium isopropoxide and furthermore, 0.5 mol of diethanolamine. The resultant solution was added dropwise to methoxyethanol in which 2 mols of water was dissolved to carry out hydrolysis to obtain a colloidal sol (solution A). To the solution A was added a solution (solution B) prepared by dissolving lead acetate, barium acetate, boric acid and acidic silica sol in methoxyethanol at the ratio of Sr:Ba:B:Si= 2.1:0.9:2:1. The composition of the resulting solution can be expressed by $0.6(Sr_{0.7}Ba_{0.3})ZrO_3$-$0.2(2Sr_{0.7}Ba_{0.3}O$-$B_2O_3)$-$0.1(Sr_{0.7}Ba_{0.3}O$-$SiO_2)$.

To this solution was added 0.5% by weight of ethylcellulose. The resulting solution was dip coated five times to obtain a coating of about 1 μm thick on a copper plate covered with Ag and Ti in thicknesses of 0.5 and 0.06 μm, respectively. Then, the resulting coating was fired in the air at 650° C. for 30 minutes to obtain a transparent dielectric thin film. The electric characteristics of the dielectric thin film were measured to obtain a dielectric constant of 650, a dielectric loss of 1.0% and an insulation of 100%. The formation of the crystal phase was confirmed by X-ray diffraction.

EXAMPLE 20

500 ml of an aqueous solution containing a mixture of 0.2 mol of barium chloride, 0.05 mol of magnesium chloride, 0.2 mol of titanium tetrachloride, 0.02 mol of boric acid and 0.01 mol of acidic silica sol was adjusted to pH 8 with ammonia under stirring to obtain a precipitate. This precipitate was filtrated and dried to obtain a powder. The particle size of the primary particles of the resulting powder was 18 nm. The powder was fired at 500° C. for 3 hours to obtain an oxide powder. The resulting oxide powder was ground in a mortar and molded into pellets of 10 mm in diameter and 1 mm in thickness by a pressing machine. The pellets were fired at 900° C. for 30 minutes in the air. The electric characteristics of the pellets were measured. (Area of electrode: 1 mm$^2$). As a result, the dielectric constant was 580, the dielectric loss was 1.5%. the insulation was 100% and the relative density was 99%. The formation of the crystal phase was confirmed by X-ray diffraction.

COMPARATIVE EXAMPLE 1 (Comparable with Example 5)

500 ml of an aqueous solution containing a mixture of 0.2 mol of barium chloride and 0.2 mol of titanium tetrachloride was adjusted to pH 9 with ammonia under stirring to obtain a gel. This gel was dried to obtain a powder. The particle size of the primary particles of the resulting powder was 18 nm. The powder was fired at 500° C. for 3 hours to obtain an oxide powder. The resulting oxide powder was ground in a mortar and molded into pellets of 10 mm in diameter and 1 mm in thickness by a pressing machine. The pellets were fired at 900° C. for 30 minutes in the air. It was seen according to X-ray diffraction that the pellets were crystallized, but single crystal particles were not recognized by a scanning electron microscope.

COMPARATIVE EXAMPLE 2 (Comparable with Example 8)

Only the solution A prepared in Example 8 was dried, ground and fired in the same manner as in Example 8. The product had a relative density of 80%. The formation of the crystal phase was confirmed by X-ray powder diffraction, but since the sample was porous, a reliable dielectric constant could not be measured.

COMPARATIVE EXAMPLE 3 (Comparable with Example 9)

0.1 mol of lead nitrate, 0.1 mol of titanium tetrachloride and 0.2 mol of oxalic acid were simultaneously added dropwise to 500 ml of water with stirring to obtain a precipitate. This precipitate was filtrated and dried to obtain titanyl lead oxalate. The particle size of the primary particles of the resulting powder was 20 nm. The powder was fired at 500° C. for 3 hours to obtain an oxide powder. The resulting oxide powder was ground in a mortar and molded into pellets of 10 mm in diameter and 1 mm in thickness by a pressing machine. The pellet was fired at 800° C. for 30 minutes in the air. The electric characteristics of the pellets were measured in the same manner as in Example 1. (Area of electrode: 1 mm$^2$). The relative density was 85%, the dielectric constant was 100, and the dielectric loss was 5.5%, and the pellets were not densified as in Example 9. The formation of $PbTiO_3$ was confirmed by X-ray diffraction, but the peak of the crystal phase was small than in Example 9 and the pellets did not appear to be sufficiently crystallized.

COMPARATIVE EXAMPLE 4 (Comparable with Example 11)

Only the solution A prepared in Example 11 was subjected to adjustment of composition, drying, ginding and firing in the same manner as in Example 13. The product had a relative density of 80%. The formation of the crystal phase was confirmed by X-ray powder diffraction, but since the sample was porous, a reliable dielectric constant could not be measured.

COMPARATIVE EXAMPLE 5

0.8 mol of barium carbonate powder having a particle size of 1 μm, 0.5 mol of titanium oxide powder having a particle size of 0.3 μm and 0.3 mol of silica powder having a particle size of 2 μm were mixed in ethanol in a ball mill and then dried to obtain a powder. The powder was molded into pellets of 10 mm in diameter and 1 mm in thickness and the pellets were fired at 800° C. The crystal phase was recognized only slightly by X-ray, and the pellet was not densified and had a void content of 40%. No reliable dielectric constant was obtained.

COMPARATIVE EXAMPLE 6 (Comparable with Example 15)

0.5 mol of lead oxide powder having a particle size of 1 μm, 0.7 mol of titanium oxide powder having a particle size of 0.3 μm, 0.5 mol of strontium carbonate powder having a particle size of 1.1 μm and 0.3 mol of silica powder having a particle size of 2 μm were mixed in ethanol in a ball mill and then dried to obtain a powder. The powder was molded into pellets of 10 mm in diameter and 1 mm in thickness and the pellets were fired at 800° C. The crystal phase was recognized only slightly by X-ray, and the pellets were not densified and had a void content of 40%. No reliable dielectric constant was obtained.

The process for manufacturing dielectrics of the present invention is lower in production cost as compared with the conventional processes by which dielectrics are produced from a slurry of a dielectric powder using a tape casting method and the like and, furthermore, according to the present invention, dielectrics of high insulation and high reliability can be obtained. Moreover, as compared with the conventional glass-ceramics prepared through a melting step, the dielectrics of the present invention are high in the proportion of crystal phase and high in dielectric constant and can be obtained without high-temperature treatment such as melting, and this the large capacitance can be realized. General effects of the present invention are improvement of insulation characteristics and decrease in reject rate. These advantageous effects contribute to development of thin film capacitors for practical use which have hitherto been difficult to put to practical use due to the problems in reliability and insulation.

Furthermore, the process for producing fine single crystal of the present invention is simpler than the conventional hydrothermal process and in addition, the product is uniform in composition and high in crystallinity and furthermore, high in controllability of particle size. Moreover, the product is high in the proportion of crystal phase than the conventional glass-ceramics prepared through a melting step and furthermore, fine single crystals of various compositions can be produced.

What is claimed is:

1. A process for producing dielectric glass-ceramics which satisfy the formula of:

$wXMO_3—(1—w)(XO_y—aGO_2)$, which comprises mixing an oxide of X, an oxide of M, an oxide of G or compounds capable of being converted to the above oxides so that a region occupied by each of the oxides or the compounds is smaller than about 0.1 $\mu$m in diameter and then, firing or heating the mixture at a temperature of 400–1200° C. at which the crystal phase of $XMO_3$ can be formed, wherein X is at least one element selected from the group consisting of Li, Na, K, Pb, Ba, Mg, Ca, Sr, La, Y and Bi, M is at least one element selected from the group consisting of Al, Mn, Ti, Zr, Sn, Mg, Zn, Fe, Co, Ni, Nb, Ta and W, G is at least one element selected from the group consisting of B, As, Sb, Si, Ge, Te and P, y and z each represent the number of oxygen, and when X is Li, Na and K, y=0.5, , when X is Pb, Ba, Mg, Ca and Sr, y=1, and when X is La, Y and Bi, y=1.5, and when G is B, As and Sb, z=1.5, when G is Si, Ge and Te, z=2 and when G is P, z=2.5, w represents a mol number, a is a real number and $0.3<w\leqq0.95$ and $\frac{1}{19}\leqq a\leqq 2$ with a proviso that when X is only Pb, M is at least one element selected from the group consisting of Zr and Ti, $0.3<w<0.95$ and $\frac{1}{19}<a\leqq 1$, when X is only Ba, M is at least one element selected from the group consisting of Zr, Ti and Sn, $0.4\leqq w\leqq 0.95$ and $\frac{1}{19}\leqq a\leqq 2$.

2. A process according to claim 1, wherein the mixing is performed by sputtering.

3. A process according to claim 1 which comprises mixing, in an organic solvent, a compound X soluble in the organic solvent which is a compound capable of being converted to the oxide of X above, a compound M soluble in the organic solvent which is a compound capable of being converted to the oxide of M and a compound G soluble in the organic solvent which is a compound capable of being converted to the oxide of G and heating and firing the resulting solution at a temperature at which each of the compounds can be converted to the oxide.

4. A process according to claim 1 which comprises heating and firing a colloidal sol of a compound X having a particle size of primary particles of smaller than 0.1 $\mu$m which is a compound capable of being converted to the oxide of X a compound M having a particle size of primary particles of smaller than 0.1 $\mu$m which is a compound capable of being converted to the oxide of M and a compound G having a particle size of primary particles of smaller than 0.1 $\mu$m which is a compound capable of being converted to the oxide of G at a temperature at which each of the compounds can be converted to the oxide.

5. A process according to claim 1 which comprises dissolving in water a compound X soluble in water which is a compound capable of being converted to the oxide of X, a compound M soluble in water which is a compound capable of being converted to the oxide of M and a compound G soluble in water which is a compound capable of being converted to the oxide of G mixing the solutions and heating and firing the resulting solution, at a temperature at which each of the compounds can be converted to the oxide.

6. A process according to claim 1 wherein X is at least one element selected from the group consisting of Pb, Ba, Mg, Ca and Sr and M is at least one element selected from the group consisting of Ti, Zr, Sn, Mg, Zn, Nb, Ta and W.

* * * * *